(12) United States Patent
Wolf

(10) Patent No.: US 8,829,920 B2
(45) Date of Patent: Sep. 9, 2014

(54) POWER AMPLIFICATION OF A MULTI-TONE TEST SIGNAL

(75) Inventor: Randy L. Wolf, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 168 days.

(21) Appl. No.: 13/485,872

(22) Filed: May 31, 2012

(65) Prior Publication Data

US 2013/0320995 A1 Dec. 5, 2013

(51) Int. Cl.
*G01R 27/02* (2006.01)
*G01R 27/28* (2006.01)
*H01H 31/02* (2006.01)

(52) U.S. Cl.
USPC .............................. 324/605; 324/612; 324/555

(58) Field of Classification Search
CPC ......... G01R 23/20; G01R 27/28; G01R 27/32
USPC ........... 324/605, 622, 623, 638, 76.11, 76.12, 324/76.22, 76.28, 76.29, 76.31, 76.47, 324/76.55, 76.57, 537, 500, 555; 702/85, 702/107, 183, 189, 190, 197; 340/538.12, 340/12.34; 375/297, 318, 240.29, 343, 350; 455/114.3, 114.2, 127.3, 293, 295, 455/309, 311, 341, 213, 286, 299, 306, 307
See application file for complete search history.

(56) References Cited

U.S. PATENT DOCUMENTS

| | | | |
|---|---|---|---|
| 3,938,056 A * | 2/1976 | Pond | ............................... 330/43 |
| 4,149,122 A | 4/1979 | Parato | |
| 5,256,845 A * | 10/1993 | Schippers | ..................... 219/769 |
| 5,262,734 A | 11/1993 | Dent et al. | |
| 5,977,779 A | 11/1999 | Bradley | |
| 6,297,649 B1 | 10/2001 | Tsironis | |
| 6,396,287 B1 | 5/2002 | Kapetanic et al. | |

(Continued)

FOREIGN PATENT DOCUMENTS

WO WO2010/139968 * 12/2010 ............. G01R 31/28

OTHER PUBLICATIONS

Agilent Technologies, "High Power Amplifier Measurements Using Agilent's Nonlinear Vector Network Analyzer," Application Note 1408-19, Jan. 26, 2010, 27 pages.

(Continued)

*Primary Examiner* — Jermele M Hollington
*Assistant Examiner* — Raul Rios Russo
(74) *Attorney, Agent, or Firm* — Gibb & Riley, LLC; Michael J. LeStrange, Esq.

(57) ABSTRACT

Disclosed are a circuit and method for amplifying the power of a multi-tone input signal. The multi-tone input signal is filtered separating out one signal having a tone at a fundamental frequency from another signal having additional tones at additional frequencies. The signal having the tone at the fundamental frequency is amplified and then filtered removing any harmonics added during amplification. The signals are then recombined generating a multi-tone output signal, wherein the tone at the fundamental frequency is boosted (i.e., has a higher power in the multi-tone output signal than in the multi-tone input signal), but the additional tones at the additional frequencies are not (i.e., the additional tones at the additional frequencies have essentially the same power in the multi-tone output and input signals). Also disclosed herein are embodiments of a testing system and method incorporating the above-described circuit to allow for testing of high power devices.

17 Claims, 5 Drawing Sheets

(56) References Cited

U.S. PATENT DOCUMENTS

| | | | |
|---|---|---|---|
| 6,812,714 | B2 | 11/2004 | Verspecht et al. |
| 7,088,109 | B2 | 8/2006 | Tanbakuchi |
| 7,248,866 | B1 | 7/2007 | Tsironis |
| 7,646,268 | B1 | 1/2010 | Tsironis |
| 2004/0035837 | A1* | 2/2004 | Mitrovic et al. ......... 219/121.42 |
| 2009/0256630 | A1* | 10/2009 | Brobston .......................... 330/2 |
| 2011/0103573 | A1* | 5/2011 | Susan ...................... 379/395.01 |
| 2011/0127529 | A1 | 6/2011 | Botula et al. |

OTHER PUBLICATIONS

Agilent Technologies, "X-Parameters Enable Model Generation from Simulation or Measurement for Fast Development," Agilent NVNA and X-Parameter Simulation in ADS, http://www.home.agilent.com/upload/cmc_upload/All/1_NVNA_and_X-parameters_in_ADS.pdf?&cc=US&lc=eng, May 2012, 16 pages.

* cited by examiner

POWER AMPLIFICATION OF A MULTI-TONE TEST SIGNAL

BACKGROUND

1. Field of the Invention

The embodiments disclosed herein relate to testing of high power devices and, more particularly, to a circuit for amplifying the drive power of multi-tone test signals, to a test system that incorporates such a circuit to allow for testing of high power devices and to associated methods.

2. Description of the Related Art

High power devices (e.g., radio frequency (RF) device) are common components in modern communication systems (e.g., in cellular-based communication systems and satellite-based communication systems). Thus, characterizing the linear and non-linear performance of such devices is critical during communication system design. Recently, machines have been developed that allow the non-linearities of a device under test (DUT) to be characterized and modeled. Specifically, such machines generate a test signal with multiple extraction tones (i.e., a multi-tone test signal), apply the multi-tone test signal to the DUT input and capture and analyze the resulting signal at the DUT output. Unfortunately, such machines are currently not capable of generating a test signal with the drive power required for many high-power devices. Therefore, there is a need in the art for a circuit that can amplify the drive power of multi-tone test signals and a test system that incorporates such a circuit to allow for testing of high power devices.

SUMMARY

In view of the foregoing, disclosed herein are embodiments of a circuit and associated method for amplifying the drive power of multi-tone signals. Specifically, in these signal amplification embodiments, a multi-tone input signal is filtered in order to separate out one signal having a tone at a fundamental frequency from another signal having additional tones at additional frequencies. The signal having the tone at the fundamental frequency is amplified and then filtered to remove any harmonics added during amplification. Then, the signals are recombined to generate a multi-tone output signal, wherein the tone at the fundamental frequency is power-boosted (i.e., has a higher power in the multi-tone output signal than in the multi-tone input signal), but the additional tones at the additional frequencies are not (i.e., the additional tones at the additional frequencies have essentially the same power in the multi-tone output signal and multi-tone input signal). Also disclosed herein are embodiments of a test system and associated method that incorporate a signal amplification circuit, such as that described above, to allow for testing of high power devices.

More particularly, disclosed herein are embodiments of a multi-tone signal amplification circuit. In these circuit embodiments, a first signal processor can receive a multi-tone input signal. This multi-tone input signal can have a first tone at a fundamental frequency ($f_0$) and additional tones at additional frequencies different from the fundamental frequency (e.g., at the second, third and fourth harmonics). The first signal processor can filter the multi-tone input signal in order to output both a first signal having essentially only the first tone at the fundamental frequency ($f_0$) without the additional tones and a second signal having essentially only the additional tones at the additional frequencies without the first tone. A second signal processor can amplify the first signal in order to output a third signal with a power-boosted first tone at the fundamental frequency ($f_0$). A third signal processor can filter the third signal in order to terminate harmonics added to the third signal by the second signal processor during amplification and output a fourth signal that retains essentially only the power-boosted first tone at the fundamental frequency ($f_0$). Finally, a fourth signal processor can combine the second and fourth signals in order to output a multi-tone output signal, which like the multi-tone input signal, has a first tone at the fundamental frequency and additional tones at the additional frequencies. However, as mentioned above, due to processing by the second signal processor to amplify the first signal, the first tone will be power-boosted (i.e., will have a higher power in the multi-tone output signal than in the multi-tone input signal). Furthermore, due to the fact that the second signal with the additional tones was not amplified and the fact that the third signal processor terminated harmonics added by amplification of the first signal, the additional tones within the multi-tone output signal remain un-boosted (i.e., will have essentially the same power in the multi-tone input and output signals).

Also disclosed herein are embodiments of a method for amplifying a multi-tone signal. In these method embodiments, a multi-tone input signal can be received and filtered. Specifically, the received multi-tone input signal can have a first tone at a fundamental frequency ($f_0$) and additional tones at additional frequencies different from the fundamental frequency (e.g., at the second, third and fourth harmonics). It can be filtered in order to output a first signal having essentially only the first tone at the fundamental frequency ($f_0$) without the additional tones and a second signal having essentially only the additional tones at the additional frequencies without the first tone. The first signal can then be amplified in order to output a third signal with a power-boosted first tone at the fundamental frequency ($f_0$). Following amplification, the third signal can be filtered in order to terminate harmonics added to the third signal during amplification and output a fourth signal having essentially only the power-boosted first tone at the fundamental frequency ($f_0$). Finally, the second signal and the fourth signal can be combined in order to output a multi-tone output signal, which like the multi-tone input signal, has a first tone at the fundamental frequency and additional tones at the additional frequencies. However, as mentioned above, due to the process of amplifying the first signal, the first tone will be power-boosted (i.e., will have a higher power in the multi-tone output signal than in the multi-tone input signal). Furthermore, due to the fact that the second signal with the additional tones is not amplified and the fact that harmonics added by amplification of the first signal are terminated, the additional tones within the multi-tone output signal remain un-boosted (i.e., will have essentially the same power in the multi-tone input and output signals).

Also disclosed herein are embodiments of a test system that incorporates a multi-tone signal amplification circuit, such as that described above, to allow for testing of high power devices. Specifically, the test system can comprise a network analyzer and a signal amplification circuit. This network analyzer can generate a multi-tone input signal. This multi-tone input signal can have a first tone at a fundamental frequency ($f_0$) and additional tones at additional frequencies different from the fundamental frequency (e.g., at the second, third and fourth harmonics). The signal amplification circuit can receive the multi-tone input signal from the network analyzer and can process that multi-tone input signal into a multi-tone output signal with a power-boosted tone at the fundamental frequency ($f_0$). That is, the signal amplification circuit can process the multi-tone input signal into a multi-tone output signal, which, like the multi-tone input signal, will have the first tone at the fundamental frequency ($f_0$) and the additional tones at the additional frequencies. However, the processing can be performed such that the first tone will be power-boosted (i.e., will have a higher power in the multi-tone output signal than in the multi-tone input signal) and the additional tones will remain un-boosted (i.e., will have essentially the same power in the multi-tone input and output signals). The network analyzer can then receive this multi-tone output signal with the power-boosted tone at the fundamental frequency ($f_0$) from the signal amplification circuit and can apply it to a device under test (DUT) and, particularly, to a high power DUT in order to characterize linear and non-linear characteristics of the DUT.

Also disclosed herein are embodiments of a testing method that amplifies a multi-tone signal (e.g., in essentially the same manner as described above in the signal amplification method embodiments) to allow for testing of high power devices. Specifically, the method can comprise generating a multi-tone input signal. This multi-tone input signal can have a first tone at a fundamental frequency ($f_0$) and additional tones at additional frequencies different from the fundamental frequency (e.g., at the second, third and fourth harmonics). The multi-tone input signal can then be processed into a multi-tone output signal with a power-boosted tone at the fundamental frequency ($f_0$). That is, the multi-tone input signal can be processed into a multi-tone output signal, which, like the multi-tone input signal, will have the first tone at the fundamental frequency ($f_0$) and the additional tones at the additional frequencies. However, processing can be performed such that the first tone will be power-boosted (i.e., will have a higher power in the multi-tone output signal than in the multi-tone input signal) and the additional tones will remain un-boosted (i.e., will have essentially the same power in the multi-tone input and output signals). Then, this multi-tone output signal with the power-boosted tone at the fundamental frequency ($f_0$) can be applied to a device under test (DUT) and, particularly, to a high power DUT in order to characterize linear and non-linear characteristics of the DUT.

BRIEF DESCRIPTION OF THE DRAWINGS

The embodiments disclosed herein will be better understood from the detailed description with reference to the following drawings, which are not necessarily drawn to scale and in which.

DETAILED DESCRIPTION

Figure 1:
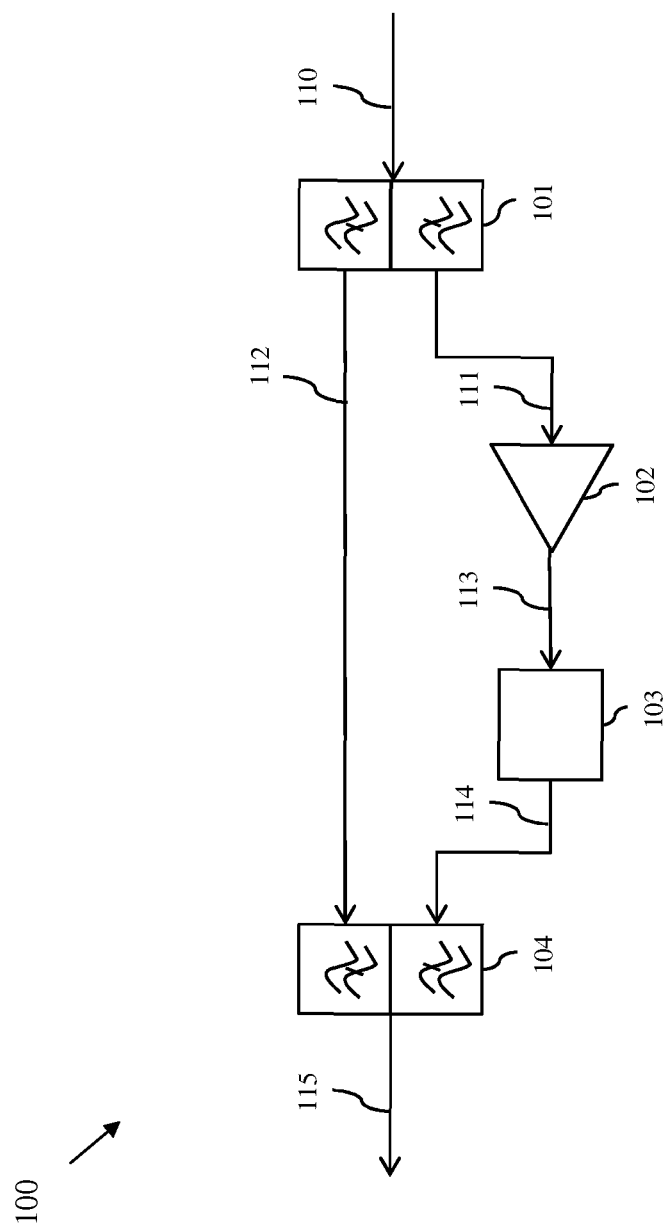
FIG. 1 is a schematic drawing illustrating an embodiment of a multi-tone signal amplification circuit.

As mentioned above, high power devices (e.g., radio frequency (RF) device) are common components in modern communication systems (e.g., in cellular-based communication systems and satellite-based communication systems). Thus, characterizing the linear and non-linear performance of such devices is critical during communication system design. Recently, machines have been developed that allow the non-linearities of a device under test (DUT) to be characterized and modeled (e.g., see Premier Network Analyzer-X (PNA-X) of Agilent Technologies, Inc. of Santa Clara, Calif. or similar network analyzers). Specifically, such machines generate a test signal with multiple extraction tones (i.e., a multi-tone test signal), which are often referred to, for example, as X-tones, apply the multi-tone test signal to the DUT input and capture and analyze the resulting signal at the DUT output. Unfortunately, such machines are currently not capable of generating a test signal with the drive power required for many high-power devices. For example, such machines typically can only provide a drive power of up to 15 dBm (decibel milliwatts), whereas a drive power of up to 25 dBm is required for many high-power devices.

One proposed solution is to integrate a signal amplifier into the machine to amplify the test signal prior to application to the DUT. However, such a signal amplifier must have a bandwidth (BW) that covers essentially all of the tones in the multi-tone signal and must be able to do so without adding additional harmonics. For example, a typical multi-tone test signal generated by network analyzer may have a first tone at the fundamental frequency ($f_0$) of the DUT and may have extraction tones (i.e., X-tones) at the second, third and fourth harmonics. Those skilled in the art will recognize that a harmonic of a wave is a component frequency of the signal that is an integer multiple of the fundamental frequency (i.e., the extraction tone at the second harmonic is $2f_0$, at the third harmonic is $3f_0$, at the fourth harmonic is $4f_0$ and so on). Thus, if the DUT is standard 2 GHz cellular-based communication device, the signal amplifier must have a BW of 8 GHz. Unfortunately, signal amplifiers that have an 8 GHz BW and that can boost a multi-tone test signal without adding additional harmonics are not cost-effective (e.g., they can cost up to $80,000 or more). Furthermore, since the standard frequency for cellular-based communication devices is anticipated to continue to increase (e.g., to 2.5 GHz and beyond), the cost of this solution is also expected to increase. Therefore, there is a need in the art for a cost-effective circuit that can amplify the drive power of multi-tone test signals and a test system that incorporates such a circuit to allow for testing of high power devices.

In view of the foregoing, disclosed herein are embodiments of a circuit and associated method for amplifying the drive power of multi-tone signals. Specifically, in these signal amplification embodiments, a multi-tone input signal is filtered in order to separate out one signal having a tone at a fundamental frequency from another signal having additional tones at additional frequencies. The signal having the tone at the fundamental frequency is amplified and then filtered to remove any harmonics added during amplification. Then, the signals are recombined to generate a multi-tone output signal, wherein the tone at the fundamental frequency is power-boosted (i.e., has a higher power in the multi-tone output signal than in the multi-tone input signal), but the additional tones at the additional frequencies are not (i.e., the additional tones at the additional frequencies have essentially the same power in the multi-tone output signal and multi-tone input signal). Also disclosed herein are embodiments of a test system and associated method that incorporate a signal amplification circuit, such as that described above, to allow for testing of high power devices.

More particularly, referring to FIG. 1, disclosed herein are embodiments of a multi-tone signal amplification circuit 100. This circuit 100 can comprise at least four discrete signal processors 101-104 that process a multi-tone input signal 110 in order to achieve a multi-tone output signal 115 with a power-boosted tone at the fundamental frequency ($f_0$).

Figure 2A:
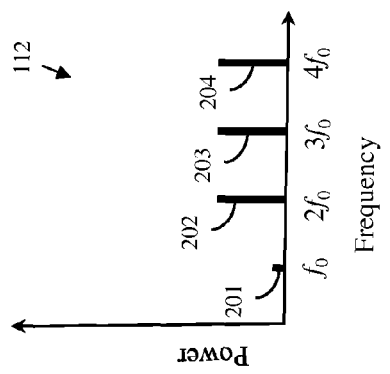
FIG. 2A is a power/frequency graph of a multi-tone input signal.

Specifically, a first signal processor 101 can receive (i.e., can be adapted to receive, can be configured to receive, etc.) a multi-tone input signal 110 (e.g., from a network analyzer). As shown in the power/frequency graph of FIG. 2A, this multi-tone input signal can have a first tone 201 at a fundamental frequency ($f_0$) and additional tones 202, 203, 204 at additional frequencies different from the fundamental frequency. For example, the additional tones 202, 203, 204 can comprise extraction tones (i.e., X-tones) at the second, third and fourth harmonics (i.e., at $2f_0$, at $3f_0$, and at $4f_0$, respectively). The first signal processor 101 can filter (i.e., can be adapted to filter, can be configured to filter, etc.) the multi-tone input signal 110 in order to output a first signal 111 and a second signal 112. This filtering can be performed so that the first signal 111 has the first tone 201 at the fundamental frequency ($f_0$) and so that it is essentially devoid of the additional tones 202-204 at the additional (e.g., higher) frequencies (i.e., so that the drive power of the additional tones 202-204 is significantly reduced below the drive power of the first tone 201, for example, so that the drive power of the additional tones 202-204 is less than $\frac{1}{10}^{th}$ (or $\frac{1}{20}^{th}$, $\frac{1}{25}^{th}$, etc.) the drive power of the first tone 201) (see FIG. 2B). Additionally, this filtering can be performed so that the second signal 112 has the additional tones 202-203 at the additional frequencies and so that it is essentially devoid of the first tone 201 at the fundamental (e.g., lower) frequency ($f_0$) (i.e., so that the drive power for the first tone 201 is significantly reduced below the drive power of the additional tones 202-204, for example, so that the drive power for the first tone 201 is less than $\frac{1}{4}^{th}$ (or $\frac{1}{5}^{th}$, $\frac{1}{10}^{th}$, etc.) the drive power of the additional tones 202-204) (see FIG. 2C). This first signal processor 101 can comprise, for example, a duplexer (as shown in FIG. 1) or any other signal processor suitable for performing such filtering.

Figure 2D:
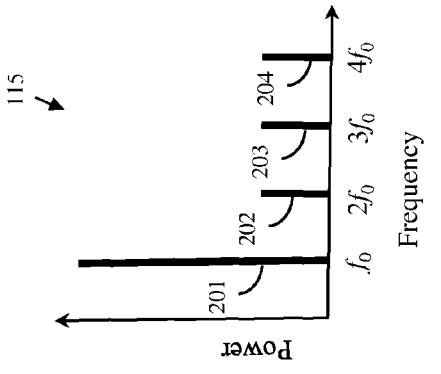
FIG. 2D is a power/frequency graph of a third signal output by a second signal processor of the circuit of FIG. 1.
Figure 2B:
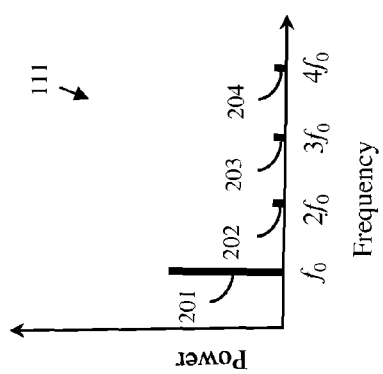
FIG. 2B is a power/frequency graph of a first signal output by a first signal processor of the circuit of FIG. 1.

A second signal processor 102 (e.g., a signal amplifier) can receive (i.e., can be adapted to receive, can be configured to receive, etc.) the first signal 111 from the first signal processor 101 and can amplify (i.e., can be adapted to amplify, can be configured to amplify, etc.) the first signal 111 in order to output a third signal 113 with a power-boosted first tone 201 at the fundamental frequency ($f_0$). That is, as shown in FIG. 2D, the first tone 201 at the fundamental frequency ($f_0$) in the third signal 113 output from the second signal processor 102 will have a relatively high drive power as compared to the drive power of the first tone 201 in the multi-tone input signal 110. In one embodiment, the fundamental frequency can be 2 GHz (e.g., the standard frequency for high power cellular-based communication devices) and the initial drive power of the first tone 201 prior to amplification (e.g., as shown in FIG. 2B) can be approximately 15 dBM. In this case, the signal amplifier 102 can, for example, comprise a 10-watt, 800 MHz to 2 GHz signal amplifier capable of providing a gain of 10 dB or more so that the drive power of the resulting power-boosted first tone 201 can be at least 25 dBm.

Figure 2E:
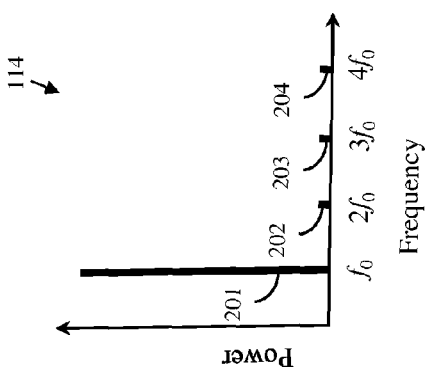
FIG. 2E is a power/frequency graph of a fourth signal output by a third signal processor of the circuit of FIG. 1.
Figure 2C:
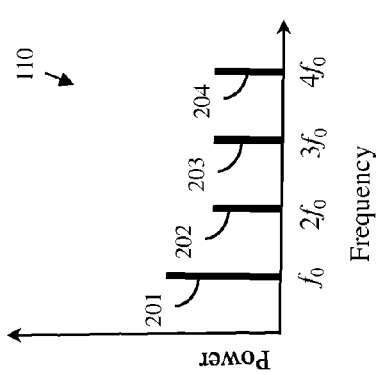
FIG. 2C is a power/frequency graph of a second signal output by the first signal processor of the circuit of FIG. 1.

Those skilled in the art will recognize that the second signal processor 102 may add unwanted harmonics back into the signal being amplified (e.g., see the relative increase in power of the additional tones 202, 203, and 204 at the second, third and fourth harmonics, as shown in FIG. 2D). Thus, a third signal processor 103 can receive (i.e., can be adapted to receive, can be configured to receive, etc.) the third signal 113 from the second signal processor 102 and can filter (i.e., can be adapted to filter, can be configured to filter, etc.) out the harmonics in the third signal 113 in order to output a fourth signal 114. Specifically, the third signal processor 103 can filter the third signal 113 so that the resulting fourth signal 114, as shown in FIG. 2E, retains the power-boosted first tone 201 at the fundamental frequency ($f_0$) and so that harmonics added to the third signal 113 by the second signal processor 102 are essentially terminated (i.e., so that the drive power of the additional tones 202-204 is significantly reduced below the drive power of the first tone 201 to a point where they will not interfere with the extraction tones, for example, so that the drive power of the additional tones 202-204 is less than $\frac{1}{10}^{th}$ (or $\frac{1}{20}^{th}$, $\frac{1}{25}^{th}$, etc.) the drive power of the first tone 201). This third signal processor 103 can comprise, for example, a duplexer, a triplexer or any other signal processor suitable for performing such filtering. It should be noted that in one embodiment only the second harmonic (i.e., see the additional tone 202) and the third harmonic (i.e., see the additional tone 203) need be terminated and any other harmonics (e.g., the fourth harmonic, a fifth harmonic, etc.) can be either terminated or reflected back, as these higher order harmonics may have little or no impact on subsequent testing using the output from the signal amplification circuit 100.

Figure 2F:
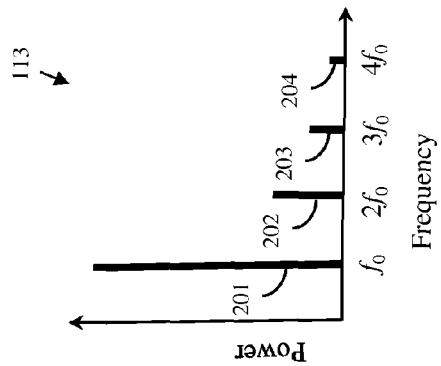
FIG. 2F is a power/frequency graph of a multi-tone output signal output by a fourth signal processor of the circuit of FIG. 1.

Finally, a fourth signal processor 104 can receive (i.e., can be adapted to receive, can be configured to receive, etc.) both the second signal 112 from the first signal processor 101 and the fourth signal 114 from the third signal processor 103. This fourth signal processor 104 can further combine (i.e., can be adapted to combine, can be configured to combine, etc.) these signals (i.e., the second signal 112 and fourth signal 114) in order to output a multi-tone output signal 115, which like the multi-tone input signal 110, has a first tone 201 at the fundamental frequency ($f_0$) and additional tones 202, 203, 204 at the additional frequencies (e.g., at $2f_0$, at $3f_0$, and at $4f_0$), as shown in FIG. 2F. However, as mentioned above, due to processing by the second signal processor 102 to amplify the first signal 111, the first tone 201 will be power-boosted (i.e., will have a higher power in the multi-tone output signal 115 than in the multi-tone input signal 110). Furthermore, due to the fact that the second signal 112 with the additional tones 202, 203, 204 was not amplified and the fact that the third signal processor 103 terminated harmonics added by amplification of the first signal 111, the additional tones 202, 203, 204 within the multi-tone output signal 115 remain un-boosted (i.e., will have essentially the same power in the multi-tone input and output signals 110, 115). This fourth signal processor 104 can comprise, for example, a duplexer, a combiner or any other signal processor suitable for performing such combining.

Figure 3:
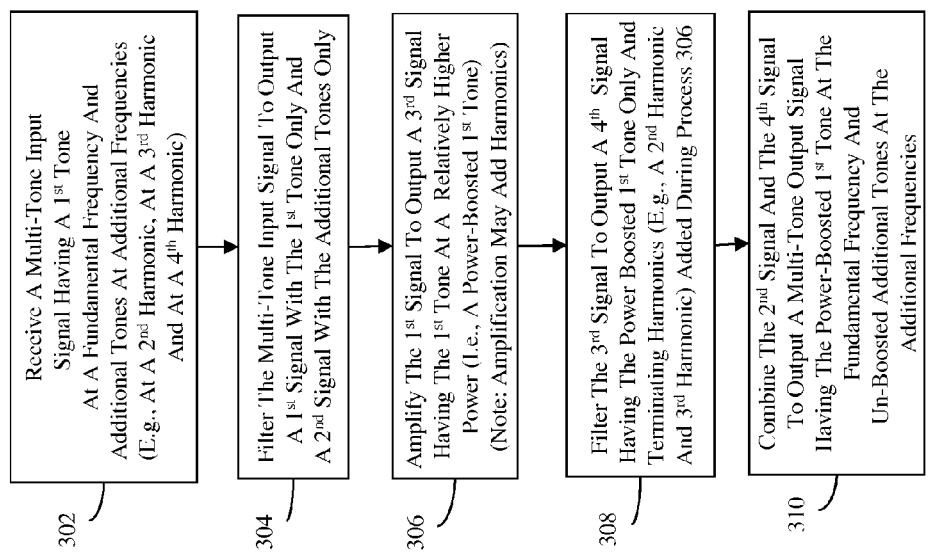
FIG. 3 is a flow diagram illustrating embodiments of a method of amplifying a multi-tone signal.

Referring to FIG. 3 in combination with FIG. 1, also disclosed herein are embodiments of a method for amplifying a multi-tone signal. This method can comprise various discrete steps for processing a multi-tone input signal in order to achieve a multi-tone output signal with a power-boosted tone at the fundamental frequency ($f_0$).

Specifically, a multi-tone input signal 110 can be received (e.g., by a first signal processor 101 from a network analyzer) (302). As shown in the power/frequency graph of FIG. 2A, this multi-tone input signal can have a first tone 201 at a fundamental frequency ($f_0$) and additional tones 202, 203, 204 at additional frequencies different from the fundamental frequency. For example, the additional tones 202, 203, 204 can comprise extraction tones (i.e., X-tones) at the second, third and fourth harmonics (i.e., at $2f_0$, at $3f_0$, and at $4f_0$, respectively). The multi-tone input signal 110 can be filtered (e.g., by first signal processor 101) in order to output a first signal 111 and a second signal 112 (304). This filtering process 304 can be performed so that the first signal 111 has the first tone 201 at the fundamental frequency ($f_0$) and so that it is essentially devoid of the additional tones 202-204 at the additional frequencies (i.e., so that the drive power of the additional tones 202-204 is significantly reduced below the first tone 201, for example, so that the drive power of the additional tones 202-204 is less than $1/10^{th}$ (or $1/20^{th}$, $1/25^{th}$, etc.) the drive power of the first tone 201) (see FIG. 2B). Additionally, this filtering process 304 can be performed so that the second signal 112 has the additional tones 202-203 at the additional frequencies and so that it is essentially devoid of the first tone 201 at the fundamental frequency ($f_0$) (i.e., so that the drive power for the first tone 201 is significantly reduced below the drive power of the additional tones 202-204, for example, so that the drive power of the first tone 201 is less than $1/4^{th}$ (or $1/5^{th}$, $1/10^{th}$, etc.) the drive power of the additional tones 202-204) (see FIG. 2C).

The first signal 111 can then be amplified (e.g., by a second signal processor 102, such as a signal amplifier) in order to output a third signal 113 with a power-boosted first tone 201 at the fundamental frequency ($f_o$) (306). That is, as shown in FIG. 2D, the first tone 201 at the fundamental frequency ($f_o$) in the third signal 113 output from the second signal processor 102 will have a relatively high drive power as compared to the drive power of the first tone 201 in the multi-tone input signal 110. In one embodiment, the fundamental frequency can be 2 GHz (e.g., the standard frequency for high power cellular-based communication devices) and the initial drive power of the first tone 201 prior to amplification (e.g., as shown in FIG. 2B) can be approximately 15 dBm. In this case, signal amplification at process 306 can be performed, for example, by a 10-watt, 800 MHz to 2 GHz signal amplifier capable of providing a gain 10 dB or more so that the drive power of the resulting power-boosted first tone 201 can be at least 25 dBm.

The signal amplification circuit 100 can receive the multi-tone input signal 110 from the network analyzer 410 and can process that multi-tone input signal 110, as described in detail above, into a multi-tone output signal 115 with a power-boosted tone at the fundamental frequency ($f_0$). That is, the signal amplification circuit 100 can process the multi-tone input signal 110 (e.g., as shown in FIG. 2A) into a multi-tone output signal 115 (e.g., as shown in FIG. 2F), which, like the multi-tone input signal 110, will have the first tone 201 at the fundamental frequency ($f_0$) and the additional tones 202, 203, 204 at the additional frequencies (e.g., at $2f_0$, at $3f_0$, and at $4f_0$, respectively). However, the processing can be performed such that the first tone 201 in the multi-tone output signal 115 will be power-boosted (i.e., will have a higher power in the multi-tone output signal 115 than in the multi-tone input signal 110) and the additional tones 202, 203, 204 will remain un-boosted (i.e., will have essentially the same power in the multi-tone input and output signals).

Those skilled in the art will recognize that the signal amplification at process 306 may add unwanted harmonics back into the signal being amplified (e.g., see the relative increase in power of the additional tones 202, 203, and 204 at the second, third and fourth harmonics, as shown in FIG. 2D). Thus, the third signal 113 can be filtered (e.g., by a third signal processor 103) to remove the harmonics and output a fourth signal 114 (308). Specifically, the third signal 113 can be filtered so that the resulting fourth signal 114, as shown in FIG. 2E, retains the power-boosted first tone 201 at the fundamental frequency ($f_0$) and so that harmonics added to third signal 113 by the second signal processor 102 are essentially terminated (i.e., so that the drive power of the additional tones 202-204 is significantly reduced below the drive power of the first tone 201 to a point where they will not interfere with the extraction tones, for example, so that the drive power of the additional tones 202-204 is less than $1/10^{th}$ (or $1/20^{th}$, $1/25^{th}$, etc.) the drive power of the first tone 201). It should be noted that in one embodiment only the second harmonic (i.e., see the additional tone 202) and the third harmonic (i.e., see the additional tone 203) need be terminated and any other harmonics (e.g., the fourth harmonic, a fifth harmonic, etc.) can be either terminated or reflected back, as these higher order harmonics may have little or no impact on subsequent testing.

Finally, the second signal 112 and the fourth signal 114 can be combined (e.g., by a fourth signal processor 104) in order to output a multi-tone output signal 115, which like the multi-tone input signal 110, has a first tone 201 at the fundamental frequency ($f_0$) and additional tones 202, 203, 204 at the additional frequencies (e.g., at $2f_0$, at $3f_0$, and at $4f_0$), as shown in FIG. 2F (310). However, as mentioned above, due to amplification of the first signal 111 at process 304, the first tone 201 will be power-boosted (i.e., will have a higher power in the multi-tone output signal 115 than in the multi-tone input signal 110). Furthermore, due to the fact that the second signal 112 with the additional tones 202, 203, 204 was not amplified and the fact that any harmonics added by amplification of the first signal 111 are terminated at process 308, the additional tones 202, 203, 204 within the multi-tone output signal 115 remain un-boosted (i.e., will have essentially the same power in the multi-tone input and output signals 110, 115).

Figure 4:
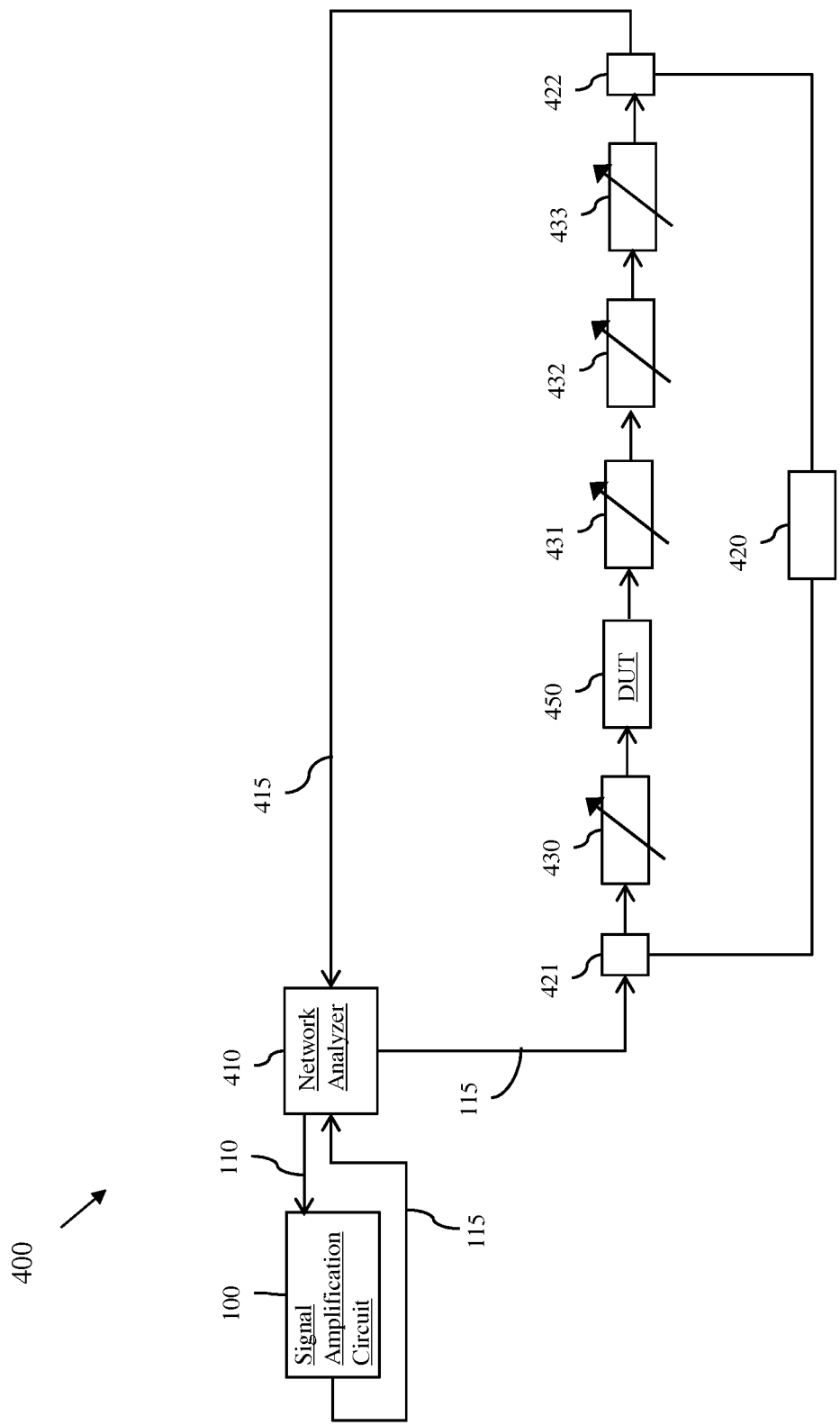
FIG. 4 is a schematic diagram illustrating an embodiment of a testing system that incorporates the multi-tone signal amplification circuit of FIG. 1.

Referring to FIG. 4, also disclosed herein are embodiments of a test system 400 that incorporates a multi-tone signal amplification circuit, such as that described above and illustrated in FIG. 1, to allow for testing of high power devices. Specifically, the test system 400 can comprise a network analyzer 410 and a signal amplification circuit 100. This network analyzer can generate a multi-tone input signal 110. As described in detail above and illustrated in FIG. 2A, such a multi-tone input signal 110 can have a first tone 201 at a fundamental frequency ($f_0$) and additional tones 202, 203, 204 at additional frequencies different from the fundamental frequency. As shown in the power/frequency graph of FIG. 2A, this multi-tone input signal can have a first tone 201 at a fundamental frequency ($f_0$) and additional tones 202, 203, 204 at additional frequencies different from the fundamental frequency. For example, the additional tones 202, 203, 204 can comprise extraction tones (i.e., X-tones) at the second, third and fourth harmonics (i.e., at $2f_0$, at $3f_0$, and at $4f_0$, respectively). Various different network analyzers are known in the art and capable of generating such a multi-tone input signal 110 (e.g., e.g., see Premier Network Analyzer-X (PNA-X) of Agilent Technologies, Inc. of Santa Clara, Calif. or similar network analyzers).

The signal amplification circuit 100 can receive the multi-tone input signal 110 from the network analyzer 410 and can process that multi-tone input signal 110, as described in detail above, into a multi-tone output signal 115 with a power-boosted tone at the fundamental frequency ($f_0$). That is, the signal amplification circuit 100 can process the multi-tone input signal 110 (e.g., as shown in FIG. 2A) into a multi-tone output signal 115 (e.g., as shown in FIG. 2F), which, like the multi-tone input signal 110, will have the first tone 201 at the fundamental frequency ($f_O$) and the additional tones 202, 203, 204 at the additional frequencies (e.g., at $2f_O$, at $3f_O$, and at $4f_O$, respectively). However, the processing can be performed such that the first tone 201 in the multi-tone output signal 115 will be power-boosted (i.e., will have a higher power in the multi-tone output signal 115 than in the multi-tone input signal 111) and the additional tones 202, 203, 204 will remain un-boosted (i.e., will have essentially the same power in the multi-tone input and output signals).

The network analyzer 410 can then receive this multi-tone output signal 115 with the power-boosted tone at the fundamental frequency ($f_O$) from the signal amplification circuit 100 and can apply it to a device under test (DUT) 450 and, particularly, to a high power DUT in order to characterize linear and non-linear characteristics of the DUT 450.

It should be noted that in this case the second signal processor 102 should comprise a signal amplifier capable of providing a specific amount of gain to the first signal such that the first tone at the fundamental frequency in the multi-tone output signal will be at a power level sufficient to drive the device under test 450. For example, if the device under test 450 is a high power cellular-based communication device that operates a 2 GHz and if the initial drive power of the first tone 201 in the first signal prior to amplification (e.g., as shown in FIG. 2B) is approximately 15 dBM, then the signal amplifier 102 can, for example, comprise a 10-watt, 800 MHz to 2 GHz signal amplifier capable of providing a gain of 10 dB or more so that the drive power of the resulting power-boosted first tone 201 can be at least 25 dBm.

For example, as shown in FIG. 4, the test system 400 can further comprise the following series-connected components: a bias tee 421, an input tuner 430 (e.g., a variable impedance), the DUT 450, output tuners 431-433 (e.g., series-connected variable impedance) for tuning at least the fundamental frequency as well as the second and third harmonics and an additional bias tee 422. The bias tees 421, 422 can supply (i.e., can be adapted to supply, can be configured to supply, etc.) DC power from a DC power supply 420 to the DUT 450, during testing. The multi-tone output signal 115 from the signal amplification circuit 100 can be supplied to the DUT 450 via the bias tee 421. The resulting output signal 415 at the additional bias tee 422 can be captured and analyzed by the network analyzer 410 to characterize the linear characteristics as well as the non-linear characteristics (e.g., the amplitudes and relative phase of harmonics generated, the impedance mismatches and frequency mixing behavior, etc.) of the DUT 450.

Figure 5:
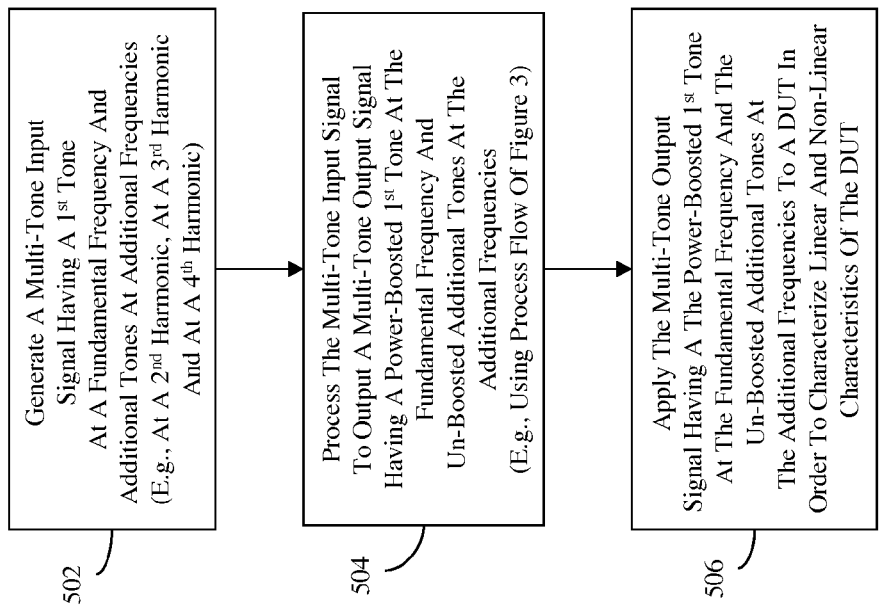
FIG. 5 is a flow diagram illustrating embodiments of a testing method.

Referring to FIG. 5 in combination with FIG. 4, also disclosed herein are embodiments of a testing method that amplifies a multi-tone signal, for example, in essentially the same manner as described above and illustrated in FIG. 3, to allow for testing of high power devices. Specifically, the method can comprise generating (e.g., by a network analyzer 410) a multi-tone input signal 110 (502). As described in detail above and illustrated in FIG. 2A, such a multi-tone input signal 110 can have a first tone 201 at a fundamental frequency ($f_O$) and additional tones 202, 203, 204 at additional frequencies different from the fundamental frequency. As shown in the power/frequency graph of FIG. 2A, this multi-tone input signal can have a first tone 201 at a fundamental frequency ($f_O$) and additional tones 202, 203, 204 at additional frequencies different from the fundamental frequency. For example, the additional tones 202, 203, 204 can comprise extraction tones (i.e., X-tones) at the second, third and fourth harmonics (i.e., at $2f_O$, at $3f_O$, and at $4f_O$, respectively).

The multi-tone input signal 110 can then be processed (e.g., by a multi-tone signal amplification circuit 100), as described in detail above an illustrated in FIG. 3, into a multi-tone output signal 115 with a power-boosted tone at the fundamental frequency ($f_O$) (504). That is, the multi-tone input signal 110 (e.g., as shown in FIG. 2A) can be processed into a multi-tone output signal 115 (e.g., as shown in FIG. 2F), which, like the multi-tone input signal 110, will have the first tone 201 at the fundamental frequency ($f_O$) and the additional tones 202, 203, 204 at the additional frequencies (e.g., at $2f_O$, at $3f_O$, and at $4f_O$, respectively). However, the processing can be performed such that the first tone 201 in the multi-tone output signal 115 will be power-boosted (i.e., will have a higher power in the multi-tone output signal 115 than in the multi-tone input signal 110) and the additional tones 202, 203, 204 will remain un-boosted (i.e., will have essentially the same power in the multi-tone input and output signals).

Then, this multi-tone output signal 115 with the power-boosted tone at the fundamental frequency ($f_O$) can be applied (e.g., by the network analyzer) to a device under test (DUT) and, particularly, to a high power DUT in order to characterize linear and non-linear characteristics of the DUT (506).

It should be noted that, for illustration purposes, the multi-tone input and output signals of the disclosed embodiments are described above and illustrated in FIGS. 2A and 2F, respectively, as having a first tone 201 and three additional tones 202-203 (e.g., at the second, third and fourth harmonics). However, it should be understood that such multi-tone input and output signals can alternatively comprise any number of one or more additional tones.

It should be understood that the terminology used herein is for the purpose of describing particular embodiments only and is not intended to be limiting of this disclosure. As used herein, the singular forms "a", "an" and "the" are intended to include the plural forms as well, unless the context clearly indicates otherwise. It should further be understood that the terms "includes", "including", "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Furthermore, the corresponding structures, materials, acts, and equivalents of all means or step plus function elements in the claims below are intended to include any structure, material, or act for performing the function in combination with other claimed elements as specifically claimed. The descriptions of the various embodiments disclosed herein have been presented for purposes of illustration, but are not intended to be exhaustive or limited as disclosed. Many modifications and variations will be apparent to those of ordinary skill in the art without departing from the scope and spirit of the disclosed embodiments. The terminology used herein was chosen to best explain the principles of the embodiments disclosed herein, the practical application or technical improvement of the embodiments disclosed herein over technologies found in the marketplace, and/or to enable others of ordinary skill in the art to understand the embodiments disclosed herein.

Therefore, disclosed above are embodiments of a circuit and associated method for amplifying the drive power of multi-tone signals. Specifically, in these signal amplification embodiments, a multi-tone input signal is filtered in order separate out one signal having a tone at a fundamental frequency from another signal having additional tones at additional frequencies. The signal having the tone at the fundamental frequency is amplified and then filtered to remove any harmonics added during amplification. Then, the signals are recombined to generate a multi-tone output signal, wherein the tone at the fundamental frequency is power-boosted (i.e., has a higher power in the multi-tone output signal than in the multi-tone input signal), but the additional tones at the additional frequencies are not (i.e., the additional tones at the additional frequencies have essentially the same power in the multi-tone output signal and multi-tone input signal). Also disclosed herein are embodiments of a test system and associated method that incorporate a signal amplification circuit, such as that described above, to allow for testing of high power devices.

Finally, it is noted that disclosed embodiments, which provide for amplifying multi-tone test signals, are more cost-effective than prior art techniques used for amplifying such signals because the disclosed embodiments require a relatively small signal amplifier that only covers the fundamental frequency ($f_0$) at issue and not a large signal amplifier that covers up to the fourth harmonic. For example, the disclosed embodiments can incorporate a relatively low cost (e.g., <$6200) 2 GHz BW signal amplifier as opposed to a relatively high cost (e.g. $80,000) 8 GHz BW signal amplifier. Furthermore, the disclosed embodiments provide a greater degree of flexibility as the standard frequency for modern communication devices continues to increase to 2.5 GHz and beyond. For example, the cost associated with replacing a 2 GHz BW signal amplifier in the disclosed embodiments with a 2.5 GHz BW signal amplifier would be relatively minimal; however, the cost associated with replacing 8 GHz BW signal amplifier with a 10 GHz BW signal amplifier would be relatively high.

What is claimed is:

1. A signal amplification circuit comprising:
   a first signal processor receiving a multi-tone input signal having a first tone at a fundamental frequency and a first drive power and further having additional tones at additional frequencies different from said fundamental frequency, said first signal processor filtering said multi-tone input signal in order to output two discrete signals, said two discrete signals comprising:
   a first signal having said first tone at said fundamental frequency and with said first drive power; and,
   a second signal having said additional tones at said additional frequencies;
   a second signal processor amplifying said first signal in order to output a third signal having said first tone at said fundamental frequency and with a second drive power that is higher than said first drive power;
   a third signal processor filtering said third signal in order to output a fourth signal having said first tone at said fundamental frequency and with said second drive power, said filtering of said third signal terminating harmonics added to said third signal by said second signal processor; and
   a fourth signal processor combining said second signal and said fourth signal in order to output a multi-tone output signal, said multi-tone output signal having said first tone at said fundamental frequency and with said second drive power and further having said additional tones at said additional frequencies.

2. The signal amplification circuit of claim 1,
   said first signal being essentially devoid of said additional tones,
   said second signal being essentially devoid of said first one, and
   said additional tones having essentially identical drive powers in said multi-tone output signal as in said multi-tone input signal.

3. The signal amplification circuit of claim 1, said additional frequencies comprising at least a second harmonic, a third harmonic and a fourth harmonic of said fundamental frequency.

4. The signal amplification circuit of claim 1, said second signal processor comprising a signal amplifier capable of providing a specific amount of gain to said first signal such that said second drive power of said first tone at said fundamental frequency in said multi-tone output signal is a power level sufficient to drive a specific device under test.

5. The signal amplification circuit of claim 1, said first signal processor comprising a duplexer.

6. The signal amplification circuit of claim 1, said third signal processor comprising any one of a duplexer and a triplexer.

7. The signal amplification circuit of claim 1, said second signal processor adding at least a second harmonic, a third harmonic and a fourth harmonic to said first signal and said third signal processor terminating said second harmonic and said third harmonic and any one of reflecting and terminating said fourth harmonic and any additional harmonics.

8. The signal amplification circuit of claim 1, said fourth signal processor comprising any one of a duplexer and a combiner.

9. A signal amplification method comprising:
   receiving a multi-tone input signal having a first tone at a fundamental frequency and with a first drive power and further having additional tones at additional frequencies different from said fundamental frequency;
   filtering said multi-tone input signal in order to output two discrete signals comprising:
   a first signal having said first tone at said fundamental frequency and with said first drive power; and
   a second signal having said additional tones at said additional frequencies;
   amplifying said first signal in order to output a third signal having said first tone at said fundamental frequency and with a second drive power that is higher than said first drive power;
   filtering said third signal in order to output a fourth signal having said first tone at said fundamental frequency and with said second drive power, said filtering of said third signal terminating harmonics added to said third signal by said amplifying; and
   combining said second signal and said fourth signal in order to output a multi-tone output signal, said multi-tone output signal having said first tone at said fundamental frequency and with said second drive power and further having said additional tones at said additional frequencies.

10. The signal amplification method of claim 9,
    said first signal being essentially devoid of said additional tones,
    said second signal being essentially devoid of said first one, and
    said additional tones having essentially identical drive powers in said multi-tone output signal as in said multi-tone input signal.

11. The signal amplification method of claim 9, said additional frequencies comprising at least a second harmonic, a third harmonic and a fourth harmonic of said fundamental frequency.

12. The signal amplification method of claim 9, said amplifying providing a specific amount of gain to said first signal such that said second drive power of said first tone at said fundamental frequency in said multi-tone output signal is at a power level sufficient to drive a specific device under test.

13. The signal amplification method of claim 9, said amplifying adding at least a second harmonic, a third harmonic and a fourth harmonic to said first signal and said filtering of said third signal terminating said second harmonic and said third harmonic and any one of reflecting and terminating said fourth harmonic and any additional harmonics.

14. A method for testing a device, said method comprising:
generating a multi-tone input signal having a first tone at a fundamental frequency and with a first drive power and further having additional tones at additional frequencies different from said fundamental frequency;
processing said multi-tone input signal into a multi-tone output signal having said first tone at said fundamental frequency and with a second drive power that is higher than said first drive power and further having said additional tones at said additional frequencies and with essentially identical drive powers in said multi-tone output signal as in said multi-tone input signal; and
applying said multi-tone output signal to a device under test in order to characterize linear and non-linear characteristics of said device under test.

15. The method of claim 14, said processing of said multi-tone input signal comprising:
filtering said multi-tone input signal in order to output two discrete signals comprising:
a first signal having said first tone at said fundamental frequency and with said first drive power; and
a second signal having said additional tones at said additional frequencies;
amplifying said first signal in order to output a third signal having said first tone at said fundamental frequency and with said second drive power;
filtering said third signal in order to output a fourth signal having said first tone at said fundamental frequency and with said second drive power, said filtering of said third signal terminating harmonics added to said third signal by said amplifying; and
combining said second signal and said fourth signal in order to output a multi-tone output signal, said multi-tone output signal having said first tone at said fundamental frequency and with said second drive power and further having said additional tones at said additional frequencies.

16. The method of claim 14, said additional frequencies comprising at least a second harmonic, a third harmonic and a fourth harmonic of said fundamental frequency.

17. The method of claim 15,
said amplifying comprising providing a specific amount of gain to said first signal such that said second drive power of said first tone at said fundamental frequency in said multi-tone output signal is at a power level sufficient to drive said device under test, and
said amplifying of said first signal comprising adding at least a second harmonic, a third harmonic and a fourth harmonic to said first signal and said filtering of said third signal terminating said second harmonic and said third harmonic and any one of reflecting and terminating said fourth harmonic and any additional harmonics.

* * * * *